United States Patent [19]

Puskas

[11] Patent Number: 4,736,130

[45] Date of Patent: Apr. 5, 1988

[54] MULTIPARAMETER GENERATOR FOR ULTRASONIC TRANSDUCERS

[76] Inventor: William L. Puskas, N. Pleasant St., P.O. Box 1676, New London, N.H. 03257-1676

[21] Appl. No.: 2,434

[22] Filed: Jan. 9, 1987

[51] Int. Cl.⁴ .............................................. H01L 41/08

[52] U.S. Cl. .................................... 310/316; 310/317; 73/647

[58] Field of Search ................. 73/570, 609, 610, 611, 73/612, 642, 647; 310/316, 317, 334; 331/116 R, 116 M; 55/15

[56] References Cited

U.S. PATENT DOCUMENTS

| | | | |
|---|---|---|---|
| 3,371,233 | 2/1968 | Cook | 310/317 |
| 3,638,087 | 1/1972 | Ratcliff | 310/317 |
| 4,398,925 | 8/1983 | Trinh et al. | 55/15 |
| 4,418,297 | 11/1982 | Marshall | 310/316 |
| 4,521,786 | 6/1985 | Bain | 310/317 |
| 4,559,826 | 12/1985 | Nelson | 310/317 |
| 4,562,413 | 12/1985 | Mishiro et al. | 310/316 |

*Primary Examiner*—Stewart J. Levy

*Assistant Examiner*—Louis M. Arana

*Attorney, Agent, or Firm*—Lowe, Price, LeBlanc, Becker & Shur

[57] ABSTRACT

An ultrasonic frequency generator sets a plurality of parameters for a transducer to enable an ultrasonic operation to meet a plurality of criteria. The generator produces sets of power trains, each formed of a sequence of power bursts of an ultrasound signal having a variable amplitude and a variable frequency. The power bursts are provided with controllable durations and are separated from one another by controllable quiet times. A cavitation density function generator controls the amplitude of the power bursts. The power trains are provided with controlled durations, and variable degas time durations are included between sequences of bursts of the ultrasonic signals. A further function generator is used to control the frequency of the signal, thus providing a swept frequency burst. A controller is provided for setting the center frequency of the swept signal. The generator thus provides a waveform with seven controllable parameters which may be set to conform to any operational criteria.

18 Claims, 3 Drawing Sheets

MULTIPARAMETER GENERATOR FOR ULTRASONIC TRANSDUCERS

TECHNICAL FIELD

This invention relates to drivers for ultrasound transducers, and more specifically to generators for controlling waveforms of ultrasonic energy applied to a transducer for application to a liquid bath for applications such as cleaning, degassing, cavitation, removal of bubbles, and the like. Still more particularly, the invention relates to circuitry for controlling a number of parameters of a signal applied to an ultrasonic transducer in order to optimize effects of the energy imparted thereby to a liquid.

BACKGROUND OF INVENTION

It is known to use energy of ultrasonic frequencies for various purposes. It is particularly known to apply ultrasound power to liquids for commercial and industrial processes such as cleaning, soldering, emulsification, pickling of steel and pasteurization.

In these and other applications, it is further known to use forms of frequency and amplitude modulation of the applied power drive frequency in order to provide performance which is improved over continuous wave (CW) operation.

Thus, the prior art teaches application of acoustic energy at swept frequencies in the range of 0.5 kHz to 60 kHz for removal of bubbles from a bath of molten glass, for example. Such an operation is known to apply acoustic energy at frequencies resonant to bubbles of different diameters in order to drive the bubbles to pressure wells and thereafter by oscillating smaller bubbles to stir liquid thereabout to facilitate breakup and absorption of the bubbles by the liquid.

Thus, in U. S. Pat. No. 4,398,925 there is disclosed a resonant generator delivering an output signal which is swept through the resonant frequencies of the bubbles. A levitation generator 20 generates a 60 kHz signal which is modulated in a mixer 24 by the output of the resonant generator, whose frequency is controlled by a frequency controller. The modulated signal is provided to an acoustical transducer and is applied thereby to the bath.

In U. S. Pat. No. 3,371,233 a multifrequency ultrasonic cleaning apparatus is disclosed. However, rather than controlling a frequency generator to produce the various frequencies, shock excitation impulses are provided in a random fashion to a rectangular transducer which, because of the various different dimensions thereof, resonates at each of its frequencies, as well as the harmonics thereof, in order to generate simultaneously a wide band of ultrasonic cleaning frequencies. The disclosure thus seeks to avoid exercising of control on the waveforms applied to the transducer, such as tuning the waveforms to desired frequencies. Instead, impulse or square wave excitation is applied to the transducer which itself provides the frequency governing elements. Thus, only a simple pulse generator is used, with fixed, invariable, parameters and thus with no control over operation of the cleaning equipment.

There is accordingly a need in the prior art for controllable pulse generators capable of generating pulses having characteristics which may be controlled to meet certain predefined operational criteria.

In most modern power ultrasonic generators intended for liquid applications, amplitude modulation (AM) of the power drive frequency is also used. Particularly, the AM is a full wave sinusoidal pattern at two times the power line frequency. More complex frequency modulation (FM) techniques are known. Two components may make up the techniques as follows. An auto-tuning system is used to maintain resonance with the output reactive load impedance and a sweep frequency component, periodic with the AM frequency, may be provided. Even in such complex systems, however, resultant advantages are typically a matter of coincidence rather than of optimum design.

It is noted, for example, that in systems of the type described above the AM pattern typically results from full wave rectification of the power line voltage. Thus, an ultrasonic generator functioning as described will have a 120 Hz AM pattern when operated in the United States, where 60 Hz AC is common. However, the same ultrasonic generator, when operated in Europe, will have a 100 Hz AM pattern because 50 Hz AC is the common line voltage. At any rate, neither of the operating frequency envelopes is related to process optimization, but rather is a matter of convenience and easily available waveform.

As to the auto-tuning component of FM, the same is a naturally occurring effect of the feedback system in power oscillators, while a sweep frequency FM is a naturally occurring phenomenon, due to the varying levels of partial saturation of the output inductance as current levels change because of the AM pattern.

In U. S. Pat. No. 3,638,087 a gated power supply is disclosed for reducing power consumption by sonic cleaners. Therein is described a variation of pulse width and repetition rate to produce a pulse-modulated power output. A sonic signal, at fixed frequency, is thus gated and output for pulsed time periods which vary in duration and repetition rate.

The disclosed circuitry includes a gate operated by a pulse generator. The gate passes a sonic control frequency generated by a sonic generator to a power output stage only when the associated pulse generator is at a given voltage level. The length of time that the gate permits an output signal to operate the power output stage is proportional to the pulse width provided thereto. Thus, by varying the width of the voltage from the pulse generator, the length of time that the gate permits a sonic output signal to operate the power output stage is varied. The output from the power stage is connected to a sonic transducer which vibrates a cleaning tank. By varying the pulse width of the signal received from the pulse generator, varying amounts of pulse width modulation or duty cycle can be obtained for the sonic frequency power output. Further, by varying the frequency of the pulse generator, the repetition rate of the pulse width modulation is varied.

In the reference it is disclosed that by varying both the pulse width and pulse frequency, the most efficient type of pulse width modulation for a sonic generator, and thus the most efficient mode of operation for the sonic cleaner, can be experimentally determined with the aid of a Fluke meter. Increased efficiency of operation is illustrated by adjusting the pulse generator to reduce by 90% the time fraction during which the sonic power output is available, to attain significant reduction in cleaning costs, at the cost of a 50% increase in time necessary to perform the cleaning operation.

However, although the reference teaches a modification of duration and repetition rate for bursts in order to attain a single objective by optimization of power usage efficiency, the prior art fails to provide sufficient control over the waveforms of sonic frequency pulses to optimize any application of ultrasonic power to a liquid. The prior art is thus deficient in optimizing application of ultrasonic power to a liquid under any defined criterion or set of criteria.

Generally, it is noted that many low volume power ultrasound applications are known. As a result, many different multiple-criterion sets are applicable for judging the efficacy of the various schemes when used in the different applications. It is thus necessary to optimize the various AM, FM or PM (pulse modulation) schemes according to a number of different criteria for each application. Techniques for variation of one or two characteristics in order to optimize the particular AM, FM or PM waveform to meet the requirements of a single criterion are thus of limited use.

Accordingly, although the above described art discloses some forms of control over applied sonic frequency and amplitude of a driving pulse, there is a need in the prior art for a method and apparatus which provides control over a sufficiently large number of parameters of the applied sonic waveform as to optimize the waveform for any given set of criteria associated with a particular application.

DISCLOSURE OF INVENTION

It is accordingly a primary object of the present invention to optimize application of ultrasound power to a liquid according to any arbitrary criteria.

It is a more specific object of the invention to provide apparatus for controlling a large number of parameters governing the form in which ultrasound power is applied in order to optimize the application according to given criteria.

It is yet another object of the invention to provide apparatus for controlling the frequency of ultrasound power applied to a liquid in order to conform to desired criteria. Still another object of the invention is the provision of apparatus for controlling the envelope of an ultrasound waveform applied to a liquid so as to conform to desired criteria.

Yet another object of the invention is the provision of apparatus for controlling power burst time, quiet time, power train time and degas time of an envelope for an ultrasonic frequency waveform applied to a transducer for ultrasonic excitation of a liquid.

It is an additional object of the invention to provide apparatus for controlling frequencies included in an ultrasound waveform applied to a transducer for ultrasonic excitation of a liquid, and for controlling the amplitude of the ultrasonic frequencies so applied.

In accordance with these and other objects of the invention, there is provided an ultrasonic frequency generator for setting a plurality of parameters for driving a transducer in accordance with any predetermined criteria. The generator comprises a controlled frequency generating means producing a frequency signal having a variably controlled swept frequency and a variably selected center frequency therefor. The frequency generating means includes a first control means for providing a time function for sweeping the frequency of said frequency signal and a second control means for setting the center frequency of the frequency signal. Additionally, programming means is provided for producing a programmed set of power trains each including a series of power bursts of the frequency signal, the power bursts having variably controlled durations and separated by variably controlled quiet times. Thus, the transducer is driven to apply bursts of ultrasonic energy to a liquid for controlled, predetermined durations and separated by controlled, predetermined quiet times at frequencies varying about a controllably selected frequency in a controlled time function.

In accordance with another aspect of the invention, there is provided an ultrasonic frequency generator for setting a plurality of parameters for driving a transducer in accordance with any predetermined criteria. The generator comprises controlled frequency generating means producing a frequency signal having variably controlled characteristics, and programming means for producing a programmed set of power trains, each including a series of power bursts of said frequency signal. The power bursts are provided with variably controlled durations and are separated by variably controlled quiet times. The programming means includes power train time control means for setting a time duration during which a sequence of the power bursts are supplied to the transducer as a power train, and degas time control means for providing a degas time of controllable duration between power trains supplied to the transducer. Thus, the transducer is driven to apply bursts of ultrasonic energy to a liquid for controlled, predetermined durations and separated by controlled, predetermined quiet times in power trains of controlled durations and separated by controlled degas times.

Other facets of the invention include combinations of controls for varying seven parameters of a waveform applied to the transducer, the use of storage means for storing sets of settings of values controlled by the control means, and means for selecting among the stored sets of settings. Additionally, closed loop control means, including microprocessor control means, may be included to provide closed loop control of at least one of the controls, thereby providing continuous selection of optimum values of parameters set thereby in accordance with progress of an application of the waveform.

The foregoing and other objects, features and advantages of the present invention will become more readily apparent to those skilled in the art to which the invention pertains upon reference to the following detailed description of one of the best modes for carrying out the invention, when considered in conjunction with the accompanying drawing in which a preferred embodiment of the invention is shown and described by way of illustration, and not of limitation, wherein:

DETAILED DESCRIPTION OF A PREFERRED EMBODIMENT

Figure 1:
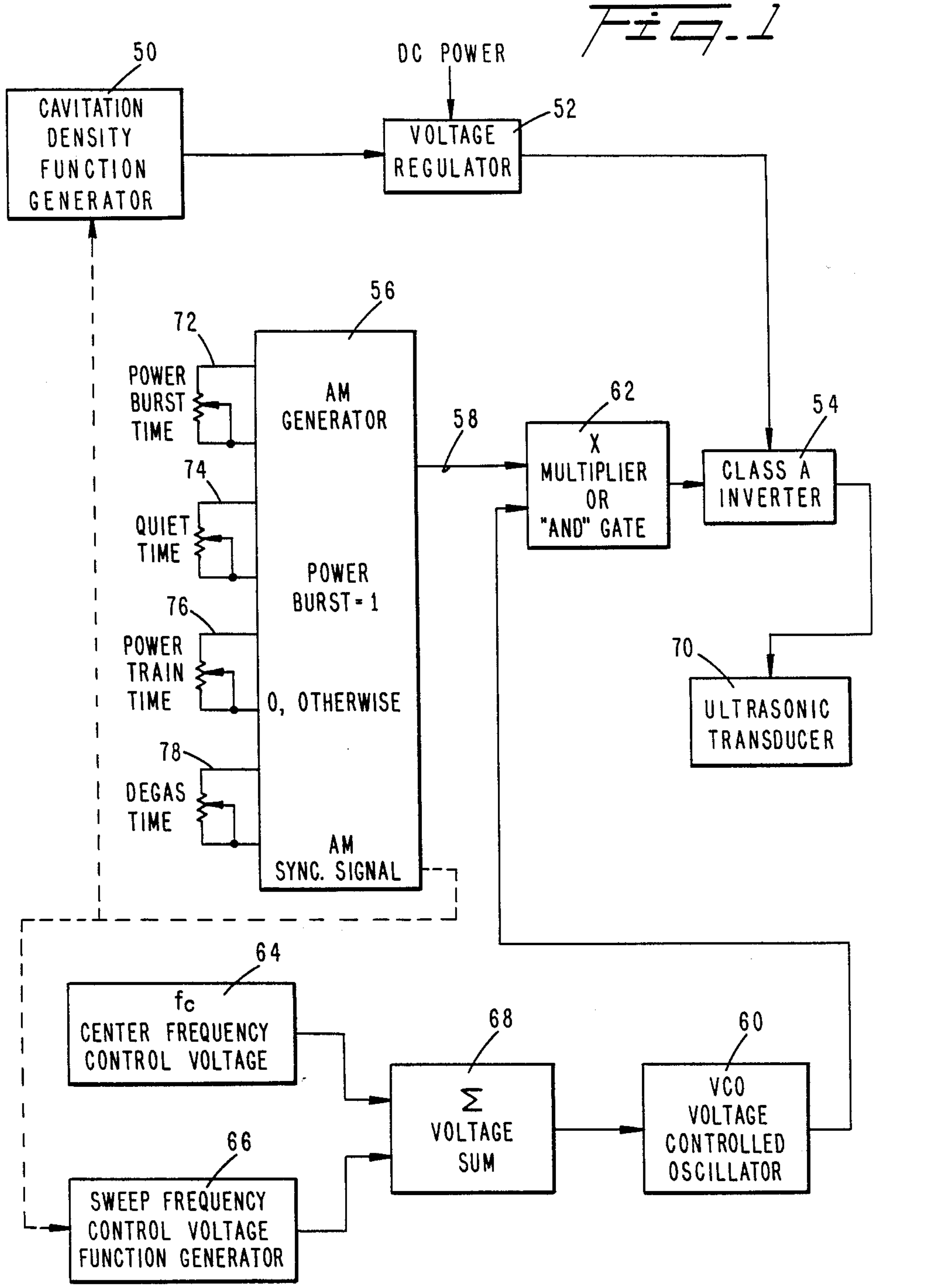
FIG. 1 shows a block diagram of a circuit structure embodying the present invention.

Referring now to the drawings, there is shown at FIG. 1 a power ultrasonic generator including controls for variation and selection of desired values for each of seven parameters of the signal. Prior to referring to and explaining operation of the generator shown in FIG. 1, the various parameters controlled thereby are described, with reference to the waveforms shown in FIGS. 2–6.

Figure 2:
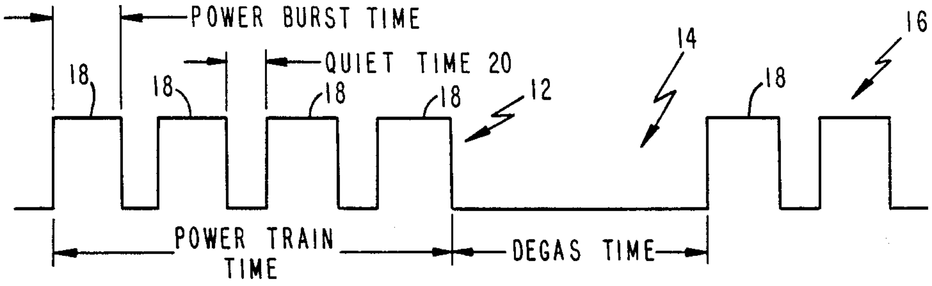
FIG. 2 shows a waveform illustrating four parameters which are varied by the inventive circuit of FIG. 1.

At FIG. 2 there is shown a pulse modulated envelope of a waveform, together with identification of several parameters thereof. More specifically, the envelope of FIG. 2 is provided for a sinusold of ultrasonic frequency. The individual sine-wave cycles are not shown, for the sake of clarity.

Figure 3:
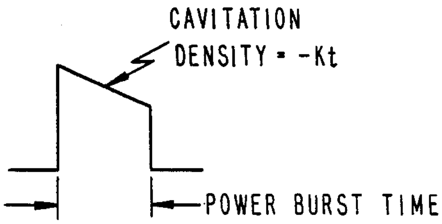
FIG. 3 shows a waveform illustrating a further parameter variable by the inventive circuit of FIG. 1.
Figure 4:
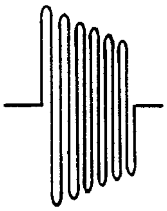
FIG. 4 shows a portion of a sonic frequency waveform output by the inventive circuit of FIG. 1 and provided to an ultrasonic transducer.
Figure 5:
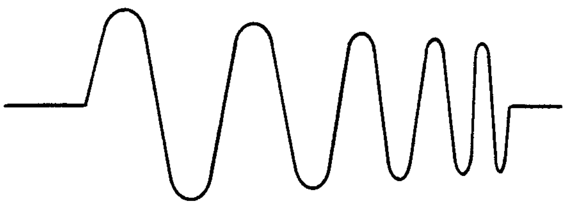
FIG. 5 illustrates a seventh parameter controlled by the inventive circuit structure of FIG. 1.

The envelope of FIG. 2 is characterized by four parameters, while a fifth parameter is shown in the detail of FIG. 3 and the sixth and seventh parameters controlled by the present invention are described with relation to the waveforms of FIGS. 4 and 5.

The waveform shown at FIG. 2 is identified as a first sequence of pulses 12, forming a first program for application of the ultrasound frequency, followed by a gap 14 and then by further sequences 16 of pulses which may continue the first program or which may have different parameter values so as to constitute a second program. For each of the pulse sequences, it is seen that a number of power burst pulses 18 are separated from one another by a quiet time period 20.

Each sequence 12, 16, . . . , forms a power train comprised of a number of pulses. The power burst pulses 18 of the power trains each have a time duration which is determined by the inventive circuit. The quiet times 20 therebetween are also set to predetermined time intervals. Thus, the width of the power pulses as well as the duty cycles thereof are determined by the inventive circuit.

Moreover, the power trains themselves are generated over a predetermined "power train time" having a predetermined time duration controlled by the circuit embodiment of FIG. 1. Thus, the present invention contemplates generation of well defined and timed pulses of ultrasound frequency signals in sequences which are themselves well defined, or limited, by the invention.

A degas time is determined by the inventive circuit and is provided as gap 14 between successive power train sequences. Accordingly, the pulse sequences generated by the present invention may repeat with appropriate degas separations. The repeating power trains may have the same or different burst, quiet and power train times, as determined by the inventive generator of FIG. 1.

Another parameter of interest is shown by the detailed waveform of FIG. 3, showing a single pulse of a predetermined power burst time. As shown therein, the amplitude of each pulse may be made to vary with time. Thus, the cavitation density associated with application of ultrasound to a liquid is controllable by the present invention. In the waveform illustrated in FIG. 3 the cavitation density is provided as a decreasing linear function of time. It will be appreciated that other functions may be provided for the cavitation density applied to each pulse. Moreover, it is noted that, for ease of illustration, the pulses shown in FIG. 1 are each provided with a constant cavitation density.

The actual waveform applied to the transducer is shown in FIG. 4, wherein the power burst is shown as a burst of ultrasound frequency signal at a linearly decreasing amplitude, corresponding to the cavitation density illustrated at FIG. 3. It is noted that the waveform of FIG. 4 is illustrated as having a substantially constant frequency. As will be described with reference to the remaining figures, the present invention is capable of selecting the specific center frequency to be applied to the transducer. Thus, yet a sixth parameter is controlled by the present invention.

Finally, a seventh parameter controlled by the present invention is shown in FIG. 5, wherein the applied frequency is seen to be varied as a function of time. In FIG. 5 the variation is linear with time, in a sweep fashion. However, other time functions may be used to alter the applied frequency.

Figure 6:
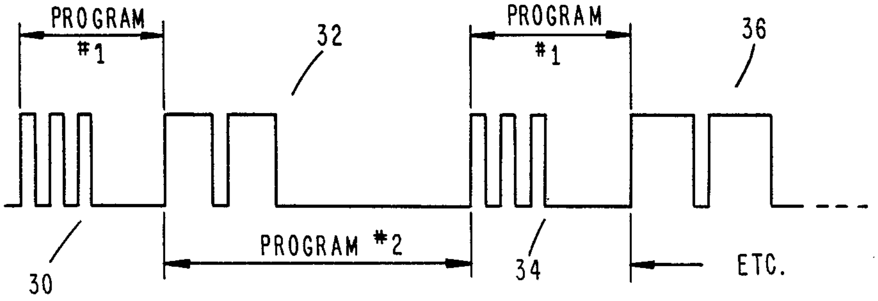
FIG. 6 shows a waveform envelope of an illustrative signal output by the inventive circuit.

At FIG. 6 there is shown a summarizing example of an amplitude pulse modulated pattern applied to an ultrasound transducer. The illustrated waveform includes several programs, shown at 30, 32, 34 and 36. As is apparent from the waveform, the various programs include power trains which are separated from one another by degas times. The degas times may have different durations, in accordance with the objectives of the several programs.

Further, the power bursts of each program may be controlled by the inventive circuit to have different parameter values in order to achieve the desired objectives by meeting the operational criteria set therefor.

Illustratively, the durations of the power bursts may be between 25 microseconds and 250 milliseconds. The quiet time periods may be between 25 microseconds and 50 milliseconds in duration. There may be from one to 1000 power bursts in a power train and the degas time separating power trains may be between 1 millisecond and one second in duration. Cavitation density provided as a function of time preferably does not go to zero during the power burst, thus giving all power bursts straight leading and trailing edges.

The center value of the drive frequency, i.e., the average value thereof over one repetitive cycle of the sweep frequency, is preferably selected to be within a reasonant range of the transducer. Similarly, the minimum and maximum frequencies of the sweep frequency function are preferably within a resonant range of the transducer.

Referring now to FIG. 1, the illustrated block diagram shows one possible implementation of the ultrasonic power generator used to control the various parameters of the program waveforms hereinabove described. Therein, a triggered cavitation density function generator 50 controls the output voltage of a voltage regulator 52 to generate the cavitation density function.

Voltage regulator 52, which may be a voltage controlled switching regulator of a type known in the art, supplies DC power input thereto to a class A inverter 54. Inverter 54 may be designed in accordance with the description in the General Electric SCR Manual, Sixth Ed., at page 354. The output of inverter 54 is thus amplitude modulated with the cavitation density function.

An AM generator 56 provides a logic 1 output level on an output 58 thereof whenever a power burst is to occur. A voltage controlled oscillator (VCO) 60 outputs an oscillating signal which is modulated with the output of AM generator 56 in a multiplier (or AND gate) 62. As will be understood from the diagram of FIG. 1, multiplier 62 only passes the controlled frequency signal from VCO 60 during power burst times defined by those times wherein the output of AM generator 56 is at a logic 1 level.

In order to control the frequency of the signal being modulated by multiplier 62, the center and instantaneous frequencies of the VCO are controlled by a center frequency control voltage source 64 and by a triggered sweep frequency control voltage function generator 66. The voltages produced by control voltage source 64 and control voltage function generator 66 are summed in a voltage summing circuit 68. The output of voltage summing circuit 68, a voltage proportional to the proper drive frequency, is input to the voltage controlled oscillator 60 in order to control the output frequency thereof.

VCO 60 converts the output voltage of summing circuit 68 to the proper frequency. The output signal of VCO 68, which is actually a FM signal, is passed by multiplier 62 to drive an input of inverter 54. The output of inverter 54 is thus applied to an input of an ultrasonic transducer 70 whenever the output of AM generator 56 is at a 1 level.

It should be appreciated that various modifications may be made in the above described circuit. One such modification may provide a modulating power AND gate, controlled by AM generator 56, for the output of inverter 54 rather than for the output of VCO 60. Thus, VCO 60 may constantly drive inverter 54, and the output of the inverter may be modulated rather than the output of VCO 60. Another modification may be seen in FIG. 7, while still other modifications may occur to those skilled in the art.

A trigger pulse is provided by AM generator 56 to function generator 50 and sweep frequency function generator 66 when a power burst starts. Thus, the two variables which are functions of time are triggered in synchronism with start of the burst. The sync signal is provided on a dashed line shown in FIG. 1.

The durations of the power burst, the quiet time, the power train time and the degas time are all controlled by appropriate controls, shown as respective potentiometers 72, 74, 76 and 78 in FIG. 1. However, other controls may be used. The particular cavitation density function output by generator 50, the center frequency voltage output by source 64 and the sweep frequency output by generator 66 are similarly controlled, although the specific controls are not illustrated in FIG. 1.

Figure 7:
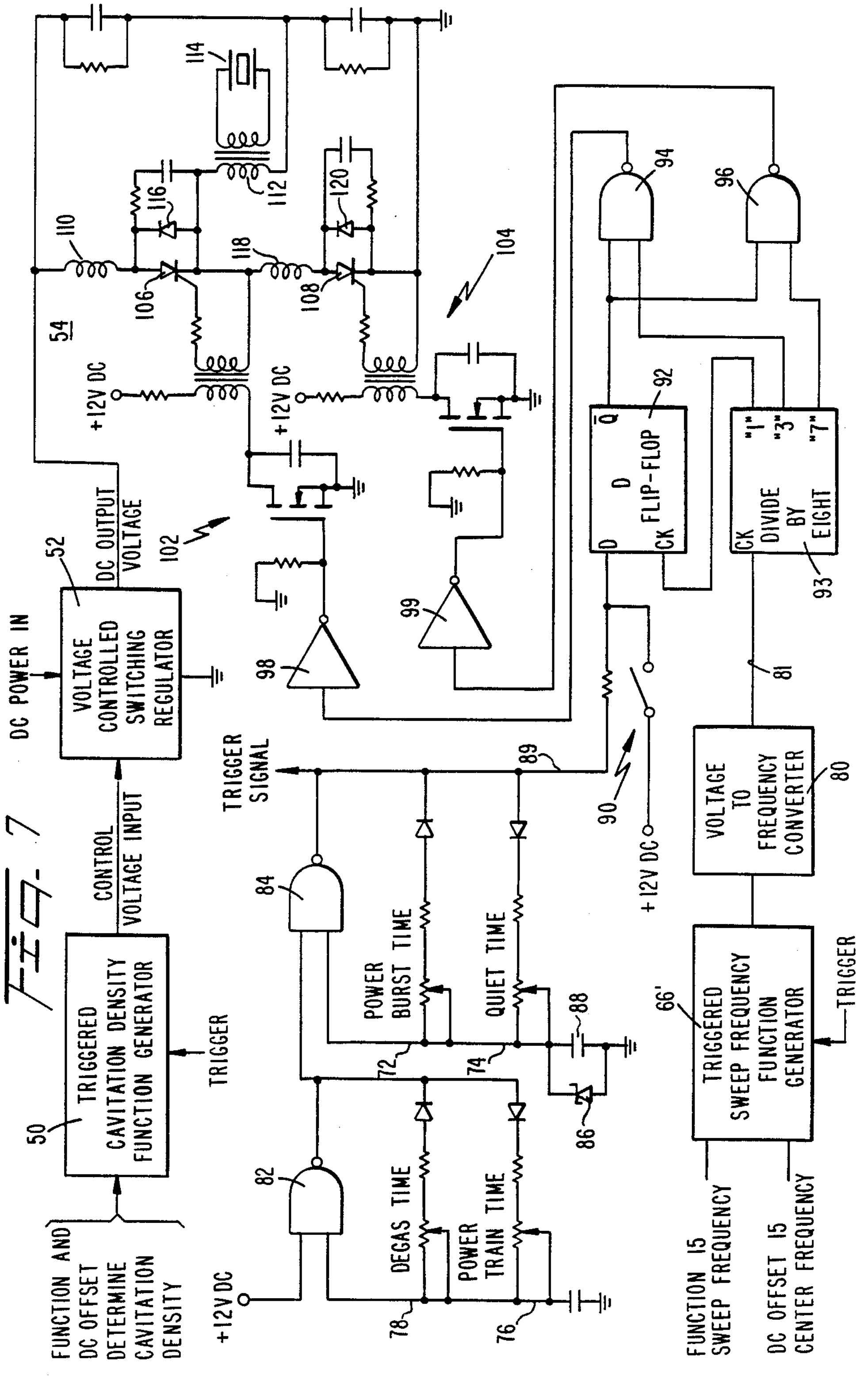
FIG. 7 shows a partial schematic of a prototype generator built in accordance with the block diagram of FIG. 1.

Referring now to FIG. 7, a more detailed schematic diagram is provided for the embodiment illustrated in FIG. 1. The diagram of FIG. 7 represents a prototype generator built to test the practicality of various values and parameters used in the circuit. Details of well known or commercially available components are not shown in the schematic since one of ordinary skill in the art may easily obtain and incorporate the appropriate components. For example, the input DC power provided to the voltage regulator 52 may be obtained from a full wave bridge rectifier (not shown) which receives AC power from a power line as an input. Sufficient electrolytic capacitance would be provided in the AC to DC rectifier to filter out undesired ripple. Voltage controlled switching regulator 52 is commercially available and uses circuitry well known to routineers in the art of circuit design.

Similarly, triggered function generators 50 and 66 are commercially available from most electronic instrument manufacturers. In a slight modification of the circuit shown in FIG. 1, it is noted that a function generator 66' is shown in FIG. 7 as receiving two inputs, including a function which identifies the sweep frequency function and a DC offset which sets the center frequency for modulation in multiplier 62. Thus, the function generator 66' essentially includes the center frequency control voltage source 64, the control voltage function generator 66 and the voltage summing circuit 68 shown in FIG. 1. The output of generator 66' is provided to a voltage to frequency converter 80, representing the VCO 60 of FIG. 1. The frequency modulated signal output by converter 80 is provided on a line 81. Converters of the type shown as 80 are available in integrated circuit (IC) form from many manufacturers such as Analog Devices.

The remaining circuitry is shown in greater detail, including easily available components such as NAND schmidt triggers, D-type flip flops, NAND gates and inverting amplifiers. Although CMOS IC chips were used in forming the circuit illustrated in FIG. 7, it should be recognized that other logic families, such as TTL, could also be used.

The following description is provided to explain operation of the circuit of FIG. 7.

The details of the circuitry of controllers 72, 74, 76 and 78 for controlling four of the parameters specified for the present invention, specifically for controlling durations of power burst time, quiet time, power train time and degas time, respectively, are shown in FIG. 7. These four AM parameters for the power trains are produced by a circuit including two astable multivibrators formed of NAND gate schmidt triggers 82, 84. The potentiometers are used to control ON and OFF times of the multivibrators by variation of RC time constants, in a manner which is well known in the art.

For example, the resistors of each of the potentiomers are in series with a separate resistor, assuring that the total resistance does not drop to zero. The sum of the two resistances, multiplied by the capacitance of a capacitor connected thereto, determine the appropriate time for the designated parameter.

Control of the cavitation density function generator 50 is attained by selecting an appropriate DC offset voltage for input to the function generator 50 and by setting controls thereon to provide the optimal time function for cavitation density. The resulting density control voltage function is fed to a control input of switching regulator 52, which provides an output DC voltage capable of supplying the power needed by the output stage of class A inverter 54. The output of regulator 52 forms a DC level which varies as the cavitation density function of time. Such variation is achieved by using a well known method of pulse width modulation within switching regulator 52.

By powering the class A inverter with the cavitation density function, the envelope of the inverter output is thus the desired function of time, giving the proper cavitation density AM pattern to the load transducer.

Two additional parameters controlled by the present invention, including the sweep frequency function and the center frequency thereof, are included in the FM signal on line 81. This signal, provided by the voltage-to-frequency converter 80, is generated in response to a control voltage input thereto. The control voltage is provided by function generator 66' and represents the two frequency parameters (center frequency and sweep frequency function) controlled by the present invention.

A Zener diode 86 is provided in parallel with the capacitor 88 which controls power burst and quiet times. The Zener diode keeps capacitor 88 from charging to a voltage higher than the normal operating peak occurring during a degas time. Thus, the first power burst generated by the inventive circuit remains at the same width as that in follow-on power bursts in a power train.

The output of the multivibrators 82, 84 is provided on a line 89 through a resistor-switching combination 90 to the D-input of a flip flop 92, clocked by the "1" output of a divide-by-eight counter 93, which in turn is clocked by the output of the voltage to frequency converter 80. The output of schmidt trigger 84 has the form of the waveform shown in FIG. 2, inverted.

The output of flip flop 92 and divide-by-eight counter 93 are provided to gates 94, 96, which form the multiplier 62 of FIG. 1. Gates 94, 96 provide outputs to inverters 98–99. The above described arrangement of gates 92–99 thus pass the oscillating signal only when a power burst time occurs.

An advantage of the gating arrangement using elements 92–94, 96, 98 and 99 shown in FIG. 7 over a simpler AND gate arrangement is the prevention of unwanted spikes to the class A inverter input when unsynchronized AM and FM signals reach the gates under changing conditions. Thus, the circuit of FIG. 7 is selected because of practical considerations for achieving a more reliable operation.

The gating arrangement operates as follows. During each eight periods of the generated sonic frequency waveform on line 81, counter 93 outputs eight consecutive pulses on outputs 0, 1, . . . 7 thereof. The second pulse in the string is output on output lead 1. The leading edge of the second pulse clocks flip-flop 92, which thus samples the condition of the AM pattern on line 89. If a "0" is present in the signal on line 89, which represented an inverted form of the waveform shown in FIG. 2, a power burst is to be generated. In response to clocking in the "0" to flip-flop 92, there is provided on the inverted output thereof a "1". The inverted output remains at "1" for the entire cycle, i.e., including times when pulses 3 and 7 are provided by counter 93, since the flip flop 92 will maintain its output until clocked by the next pulse on output 1 of counter 93, which occurs in the next cycle.

Gates 94 and 96, which are thus enabled by the output of flip flop 92, pass the 3 and 7 pulses from counter 93 to inverter/buffers 98 and 99 whenever the signal on line 89 was at "0" during the second pulse, 1, output by the counter. At other times, i.e., when the signal on line 89 is at "1" during the second pulse, pulses 3 and 7 are blocked.

Inverter buffers 98 and 99 supply the proper signals for trigger circuits 102 and 104, which respectively trigger ASCR's 106 and 108 of the inverter 54. Thus, a complete set of trigger signals always occurs because of operation of flip flop 92.

The Class A inverter 54 functions as follows. ASCR 106, when triggered, supplies current through an inductor 110 to a transformer 112, which charges load transducer 114. Current returns through the transformer, a diode 116, and inductor 110 until ASCR 108 is triggered. Upon triggering of ASCR 108, current flows through an inductor 118, ASCR 108, and transformer 112 to charge the load 114 in the opposite direction. Current returns through a diode 120, inductor 118 and the transformer 112 until the cycle repeats by again triggering ASCR 106.

The foregoing description of the preferred embodiment of the invention has been presented for purposes of illustration and description and is not intended to be exhaustive or to limit the invention to the precise forms disclosed, since many modifications and variations are possible in light of the above teaching. Some modifications have been described in the specifications, and others may occur to those skilled in the art to which the invention pertains.

For example, it is contemplated that various sets of values for the parameters controlled by the present invention may be stored, and that, by automatic or manual selection of an appropriate set of parameter values, each of the control devices used therein may be controlled in order to provide a particular waveform to the transducer. Thus, a program may include successive power trains of different characteristics and having different parameter values. Additionally, a closed loop control system is contemplated which, under control of a microprocessor for example, may automatically vary the parameters provided by the inventive arrangement to the waveform in order to optimize the variable values for a particular process being performed.

Alternatively, one or more of the parameters may be set to optimum constants, or fixed functions, corresponding to a particular class of applications. Others of the parameters may be adjusted to optimize performance of a specific application within the class of applications.

The preferred embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with the full breadth to which they are legally and equitably entitled.

I claim:

1. An ultrasonic frequency generator for setting a plurality of parameters for driving a transducer in accordance with any predetermined criteria comprising:

controlled frequency generating means producing a frequency signal having a variably controlled swept frequency and variably selected center frequency therefor, said frequency generating means including:

first control means for providing a time function for sweeping the frequency of said frequency signal and second control means for setting the center frequency of said frequency signal, and programming means for producing a programmed set of power trains each including a series of power bursts of said frequency signal, said power bursts having variably controlled durations and separated by variably controlled quiet times, whereby the transducer is driven to apply bursts of ultrasonic energy to a liquid for controlled, predetermined durations and separated by controlled, predetermined quiet times at frequencies varying about a controllably selected frequency in a controlled time function.

2. An ultrasonic frequency generator for driving a transducer in accordance with claim 1 wherein said programming means includes power train time control means for setting a time duration during which a sequence of said power bursts are supplied to the transducer as a power train, and degas time control means for providing a degas time of controllable duration between power trains supplied to the transducer.

3. An ultrasonic frequency generator for driving a transducer in accordance with claim 2, further comprising function generating means for generating a second time function to control amplitudes of said power bursts applied to the transducer and to provide said amplitudes as controlled predetermined cavitation density time functions.

4. An ultrasonic frequency generator for driving a transducer in accordance with claim 3 wherein said programming means is operable for selecting different settings of control means therein for providing different parameter values to successive power trains.

5. An ultrasonic frequency generator for driving a transducer in accordance with claim 3 wherein at least one of said control means is set to provide a value of a quantity controlled thereby which is optimum according to a criterion corresponding to a predetermined class of applications and others of said control means are user adjustable for optimization of a particular application within the class of operations.

6. An ultrasonic frequency generator for driving a transducer in accordance with claim 3 further comprising means for storing sets of settings of values controlled by said control means, and means for selecting among the stored sets of settings.

7. An ultrasonic frequency generator for driving a transducer in accordance with claim 3 further comprising closed loop control means, including microprocessor control means, for providing closed loop control of at least one of said control means thereby providing continuous selection of optimum values of parameters set thereby in accordance with progress of an application.

8. An ultrasonic frequency generator for driving a transducer in accordance with claim 1 further comprising means for storing sets of settings of values controlled by said control means, and means for selecting among the stored sets of settings.

9. An ultrasonic frequency generator for driving a transducer in accordance with claim 1 further comprising closed loop control means, including microprocessor control means, for providing closed loop control of at least one of said control means thereby providing continuous selection of optimum values of parameters set thereby in accordance with progress of an application.

10. An ultrasonic frequency generator for driving a transducer in accordance with claim 1, further comprising function generating means for generating a second time function to control amplitudes of said power bursts applied to the transducer and to provide said amplitudes as controlled predetermined cavitation density time functions.

11. An ultrasonic frequency generator for setting a plurality of parameters for driving a transducer in accordance with any predetermined criteria comprising:

controlled frequency generating means producting a frequency signal having variably controlled characterstics, and programming means for producing a programmed set of power trains each including a series of power bursts of said frequency signal, said power bursts having variably controlled durations and separated by variably controlled quiet times, said programming means includes power train time control means for setting a time duration during which a sequence of said power bursts are supplied to the transducer as a power train, and degas time control means for providing a degas time of controllable duration between power trains supplied to the transducer, whereby the transducer is driven to apply bursts of ultrasonic energy to a liquid for controlled, predetermined durations and separated by controlled, predetermined quiet times in power trains of controlled durations and separated by controlled degas times.

12. An ultrasonic frequency generator for driving a transducer in accordance with claim 11 further comprising closed loop control means, including microprocessor control means, for providing closed loop control of at least one of said control means thereby providing continuous selection of optimum values of parameters set thereby in accordance with progress of an application.

13. An ultrasonic frequency generator for driving a transducer in accordance with claim 11 further comprising means for storing sets of settings of values controlled by said control means, and means for selecting among the stored sets of settings.

14. An ultrasonic frequency generator for driving a transducer in accordance with claim 11, further comprising function generating means for generating a time function to control amplitudes of said power bursts applied to the transducer and to provide said amplitudes as controlled predetermined cavitation density time functions.

15. An ultrasonic frequency generator for driving a transducer in accordance with claim 14 further comprising multiplying means controlled by said programming means for passing said frequency signal to the transducer only at times of said power bursts of said power trains.

16. An ultrasonic frequency generator for driving a transducer in accordance with claim 15 further comprising inverting means responsive to said multiplying means and to said function generating means to provide to the ultrasonic transducer a plurality of said power trains, separated by degas times, each power train formed of a sequence of power bursts of a plurality of cycles of the frequency signal having amplitudes determined by said function generating means, the power bursts separated by quiet times.

17. An ultrasonic frequency generator for driving a transducer in accordance with claim 16 wherein said controlled frequency generating means includes:

first control means including a second function generating means for providing a second time function for sweeping the frequency of said frequency signal and second control means for setting the center frequency of said frequency signal thereby causing the transducer to impart to a liquid trains of energy bursts of controllable frequency functions about a controlled center frequency.

18. An ultrasonic frequency generator for driving a transducer in accordance with claim 11 wherein at least one of said control means is set to provide a value of a quantity controlled thereby which is optimum according to a criterion corresponding to a predetermined class of applications and others of said control means are user adjustable for optimization of a particular application within the class of operations.

* * * * *